(12) United States Patent
Wu

(10) Patent No.: US 11,537,328 B2
(45) Date of Patent: Dec. 27, 2022

(54) METHOD AND APPARATUS FOR EXECUTING HOST COMMANDS

(71) Applicant: Silicon Motion, Inc., Zhubei (TW)

(72) Inventor: Po-Wei Wu, New Taipei (TW)

(73) Assignee: Silicon Motion, Inc., Zhubei (TW)

( * ) Notice: Subject to any disclaimer, the term of this patent is extended or adjusted under 35 U.S.C. 154(b) by 1 day.

(21) Appl. No.: 17/380,402

(22) Filed: Jul. 20, 2021

(65) Prior Publication Data

US 2022/0300203 A1 Sep. 22, 2022

(30) Foreign Application Priority Data

Mar. 18, 2021 (CN) .......................... 202110289034.7

(51) Int. Cl.
*G06F 3/06* (2006.01)
(52) U.S. Cl.
CPC ............ *G06F 3/0659* (2013.01); *G06F 3/064* (2013.01); *G06F 3/0619* (2013.01); *G06F 3/0652* (2013.01); *G06F 3/0679* (2013.01)
(58) Field of Classification Search
CPC ...... G06F 3/0659; G06F 3/0619; G06F 3/064; G06F 3/0652; G06F 3/0679; G06F 2212/7201; G06F 3/061; G06F 12/1009
See application file for complete search history.

(56) References Cited

U.S. PATENT DOCUMENTS

2015/0347030 A1* 12/2015 Mathur ................. G06F 3/0611
711/118
2017/0286293 A1 10/2017 Gayman et al.
2018/0350180 A1 12/2018 Onischuk
2019/0114255 A1* 4/2019 Jain ...................... G06F 3/068
2021/0019394 A1 1/2021 Liu et al.

FOREIGN PATENT DOCUMENTS

| TW | 201802682 A | 1/2018 |
| TW | 202105219 A | 2/2021 |
| TW | 202105371 A | 2/2021 |

OTHER PUBLICATIONS

English translation of Taiwanese Search Report for Taiwanese Application No. 110109643, dated Feb. 24, 2022.

* cited by examiner

*Primary Examiner* — David Yi
*Assistant Examiner* — Dustin B. Fulford
(74) *Attorney, Agent, or Firm* — Birch, Stewart, Kolasch & Birch, LLP

(57) ABSTRACT

An apparatus and a method for executing host commands, which is performed by a host interface in a flash controller, to include: determining whether a preset number of successive unaligned host long-write commands have been detected, where a first starting logical block address (LBA) number of data to be written, which is requested by each unaligned host long-write command, does not align with a first physical page of one super page; if so, calculating an offset, so that a second starting LBA number of data to be written, which is requested by a host write command, plus the offset aligns with a first physical page of one super page; generating a third starting LBA number by adding the offset to the second starting LBA number; and storing an entry in an LBA shifting table, which includes information about the second starting LBA number and the offset.

20 Claims, 9 Drawing Sheets

(a)

(b)

METHOD AND APPARATUS FOR EXECUTING HOST COMMANDS

CROSS-REFERENCE TO RELATED APPLICATIONS

This application claims the benefit of priority to Patent Application No. 202110289034.7, filed in China on Mar. 18, 2021; the entirety of which is incorporated herein by reference for all purposes.

BACKGROUND

The disclosure generally relates to storage devices and, more particularly, to a method and an apparatus for executing host commands.

Flash memory devices typically include NOR flash devices and NAND flash devices. NOR flash devices are random access—a central processing unit (CPU) accessing a NOR flash device can provide the device any address on its address pins and immediately retrieve data stored in that address on the device's data pins. NAND flash devices, on the other hand, are not random access but serial access. It is not possible for NAND to access any random address in the way described above. Instead, the CPU has to write into the device a sequence of bytes which identifies both the type of command requested (e.g. read, write, erase, etc.) and the address to be used for that command. The address identifies a page (the smallest chunk of flash memory that can be written in a single operation) or a block (the smallest chunk of flash memory that can be erased in a single operation), and not a single byte or word.

Regularly, a flash controller executes the host commands, such as host read, write and erase commands, etc., in the First-In First-Out (FIFO) principle to read user data from designated addresses of flash units, program user data into designated addresses of flash units, and erase designated physical blocks of flash units. Efficiently executing host commands issued by the host side always been an important issue. Thus, it is desirable to have a method and an apparatus for executing host commands to improve the execution performance of host commands.

SUMMARY

In an aspect of the invention, an embodiment introduces a method for executing host commands, performed by a host interface in a flash controller. The method includes: determining whether a preset number of successive unaligned host long-write commands have been detected, where a first starting logical block address (LBA) number of data to be written, which is requested by each unaligned host long-write command, does not align with a first physical page of one super page in a flash module. If so, the method calculates an offset, so that a second starting LBA number of data to be written, which is requested by a host write command, plus the offset aligns with a first physical page of one super page in the flash module. The method generates a third starting LBA number by adding the offset to the second starting LBA number; stores an entry in an LBA shifting table, which comprises information about the second starting LBA number and the offset, where the second starting LBA number represents a separating LBA number; and outputs the third starting LBA number associated with the host write command to a designated location in a command queue, thereby enabling a firmware translation layer to drive a flash interface for programming data into the flash module in accordance with the third starting LBA address associated with the host write command.

In another aspect of the invention, an embodiment introduces an apparatus for executing host commands, at least including: a flash interface, coupled to a flash module; a random access memory (RAM); a processing unit, coupled to the RAM and the flash interface; and a host interface, coupled to a host side and the RAM. The RAM is arranged operably to allocate space for a command queue. The host interface includes an LBA shifting circuit. The LBA shifting circuit is arranged operably to determine whether a preset number of successive unaligned host long-write commands have been detected, where a first starting LBA number of data to be written, which is requested by each unaligned host long-write command, does not align with a first physical page of one super page in a flash module. If so, the LBA shifting circuit is arranged operably to calculate an offset, so that a second starting LBA number of data to be written, which is requested by a host write command, plus the offset aligns with a first physical page of one super page in the flash module. The LBA shifting circuit is arranged operably to generate a third starting LBA number by adding the offset to the second starting LBA number; store an entry in an LBA shifting table, which comprises information about the second starting LBA number and the offset, in the RAM, where the second starting LBA number represents a separating LBA number; and output the third starting LBA number associated with the host write command to a designated location in the command queue, thereby enabling a firmware translation layer to drive the flash interface for programming data into the flash module in accordance with the third starting LBA address associated with the host write command.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings.

The same reference numbers may be used throughout the drawings to refer to the same or like parts, components, or operations.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent." etc.).

Figure 1:
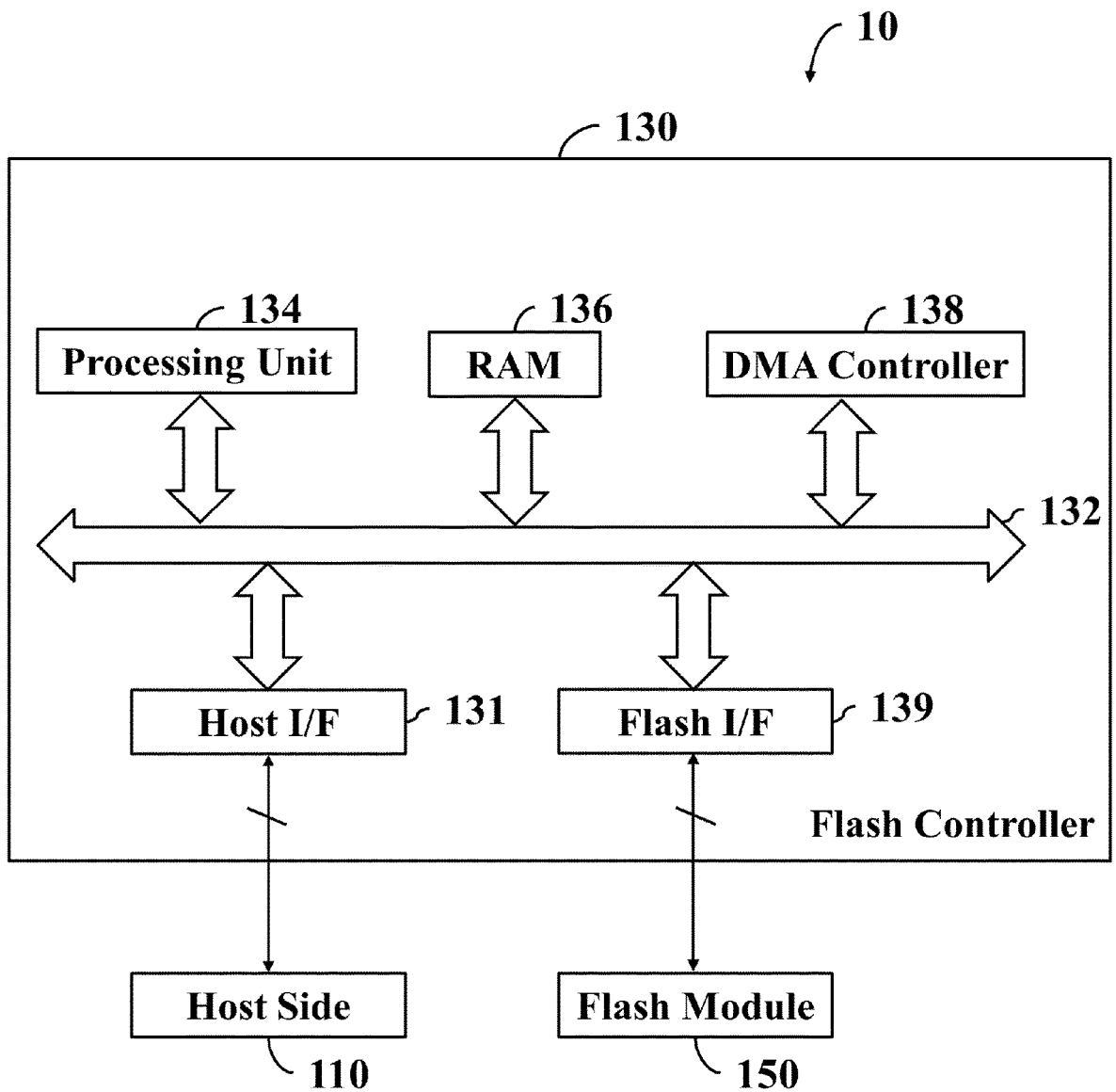
FIG. 1 is the system architecture of an electronic apparatus according to an embodiment of the invention.

Refer to FIG. 1. The electronic apparatus 100 includes a host side 110, a flash controller 130 and a flash module 150, and the flash controller 130 and the flash module 150 may be collectively referred to as a device side. The electronic apparatus 100 may be equipped with a Personal Computer (PC), a laptop PC, a tablet PC, a mobile phone, a digital camera, a digital recorder, or other consumer electronic products. The host 110 and the host interface (I/F) 137 of the flash controller 130 may communicate with each other by Universal Serial Bus (USB), Advanced Technology Attachment (ATA), Serial Advanced Technology Attachment (SATA), Peripheral Component Interconnect Express (PCI-E), Universal Flash Storage (UFS), Embedded Multi-Media Card (eMMC) protocol, or others. The flash I/F 139 of the flash controller 130 and the flash module 150 may communicate with each other by a Double Data Rate (DDR) protocol, such as Open NAND Flash Interface (ONFI), DDR Toggle, or others. The flash controller 130 includes the processing unit 134, and the processing unit 134 may be implemented in numerous ways, such as with general-purpose hardware (e.g., a microcontroller unit, a single processor, multiple processors or graphics processing units capable of parallel computations, or others) that is programmed using firmware and/or software instructions to perform the functions recited herein. The processing unit 134 may receive host commands from the host side 110 through the host I/F 131, such as read commands, write commands, erase commands, etc., schedule and execute the host commands. The flash controller 130 includes the Random Access Memory (RAM) 136, which may be implemented in a Dynamic Random Access Memory (DRAM), a Static Random Access Memory (SRAM), or the combination thereof, for allocating space as a data buffer storing user data (also referred to as host data) that has been obtained from the host side 110 and is to be programmed into the flash module 150, and that has been read from the flash module 150 and is to be output to the host side 110. The RAM 136 stores necessary data in execution, such as variables, data tables, data abstracts, host-to-flash (H2F) tables, flash-to-host (F2H) tables, or others. The flash I/F 139 includes a NAND flash controller (NFC) to provide functions that are required to access to the flash module 150, such as a command sequencer, a Low Density Parity Check (LDPC) encoder/decoder, etc.

The flash controller 130 may be equipped with the bus architecture 132 to couple components to each other to transmit data, addresses, control signals, etc. The components include but not limited to the host I/F 131, the processing unit 134, the RAM 136, the direct memory access (DMA) controller 138, and the flash I/F 139. The DMA controller 138 moves data between the components through the bus architecture 132 according to the instructions issued by the processing unit 134. For example, the DMA controller 138 may migrate data in a specific data buffer of the host I/F 131 or the flash I/F 139 to a specific address of the RAM 136, migrate data in a specific address of the RAM 136 to a specific data buffer of the host I/F 131 or the flash I/F 139, and so on.

The flash module 150 provides huge storage space typically in hundred Gigabytes (GBs), or even several Terabytes (TBs), for storing a wide range of user data, such as high-resolution images, video files, etc. The flash module 150 includes control circuits and memory arrays containing memory cells, such as being configured as Single Level Cells (SLCs), Multi-Level Cells (MLCs), Triple Level Cells (TLCs), Quad-Level Cells (QLCs), or any combinations thereof. The processing unit 134 programs user data into a designated address (a destination address) of the flash module 150 and reads user data from a designated address (a source address) thereof through the flash I/F 139. The flash I/F 139 may use several electronic signals including a data line, a clock signal line and control signal lines for coordinating the command, address and data transfer with the flash module 150. The data line may be used to transfer commands, addresses, read data and data to be programmed; and the control signal lines may be used to transfer control signals, such as Chip Enable (CE), Address Latch Enable (ALE), Command Latch Enable (CLE), Write Enable (WE), etc.

Figure 2:
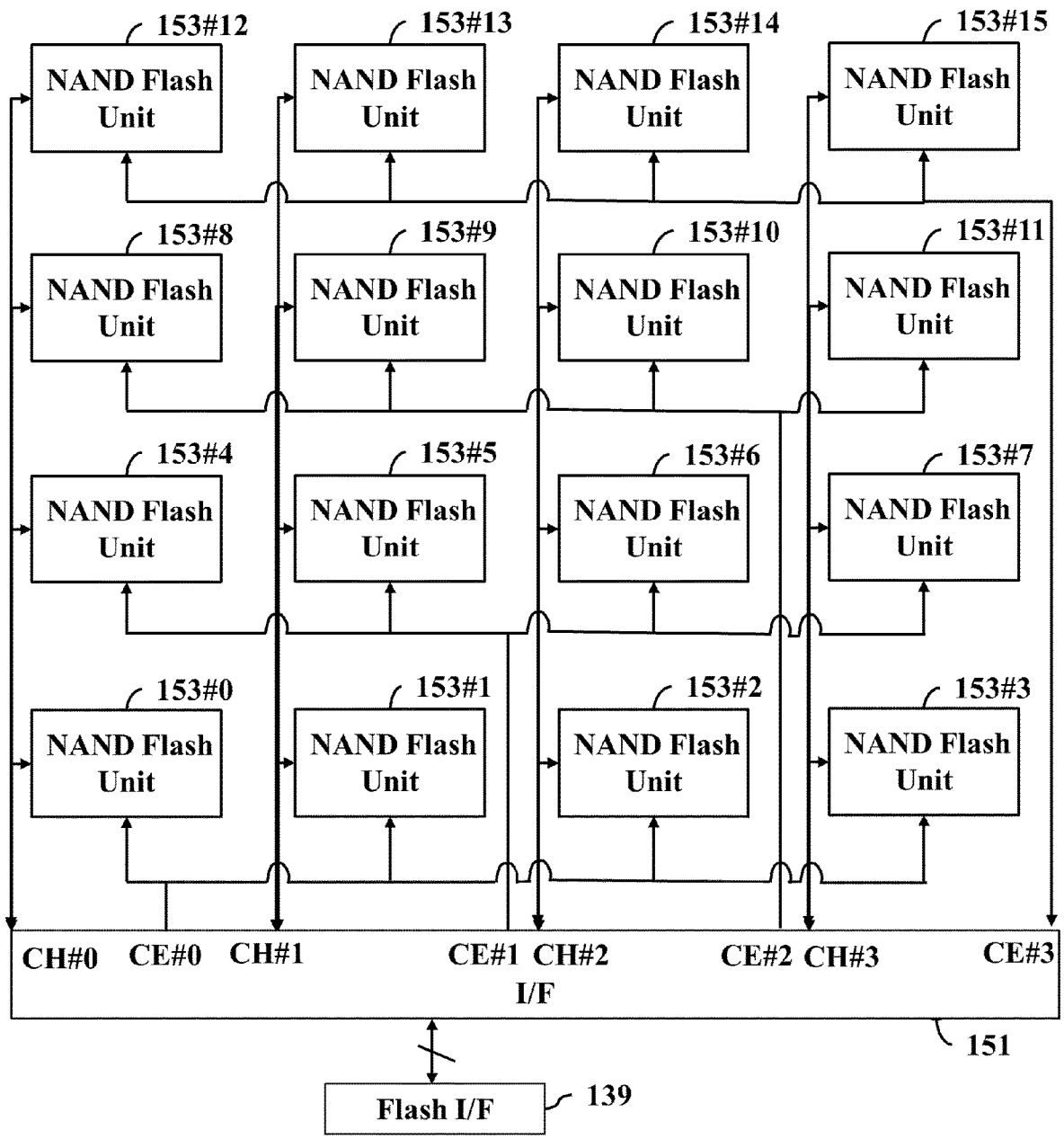
FIG. 2 is a schematic diagram illustrating a flash module according to an embodiment of the invention.

Refer to FIG. 2. The I/F 151 of the flash module 150 may include four I/O channels (hereinafter referred to as channels) CH #0 to CH #3, and each is connected to four NAND flash modules, for example, the channel CH #0 is connected to the NAND flash units 150 #0, 150 #4, 150 #8 and 150 #12. Each NAND flash unit can be packaged in an independent die. The flash I/F 139 may issue one of the CE signals CE #0 to CE #3 through the I/F 151 to activate the NAND flash modules 153 #0 to 153 #3, the NAND flash modules 153 #4 to 153 #7, the NAND flash modules 153 #8 to 153 #11, or the NAND flash modules 153 #12 to 153 #15, and read data from or program data into the activated NAND flash modules in parallel.

Figure 3:
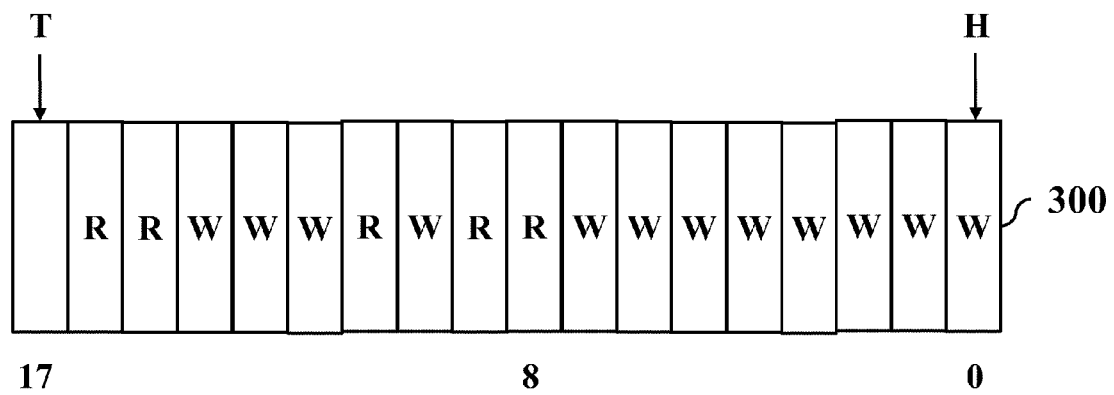
FIG. 3 is a schematic diagram of a command queue according to an embodiment of the invention.

In some embodiments, one logical block address (LBA) managed by the host side 110 may correspond to 512 bytes of data. The host side 110 may issue a host write command to the processing unit 134 through the host I/F 131 to request the device side to write multiple (e.g. 64, 128, 256, etc.) LBAs of data into the flash module 150. Additionally, the host side 110 may issue a host read command to the processing unit 134 through the host I/F 131 to read multiple LBAs of data. In order to make data access efficient, the process unit 134 may drive the flash I/F 139 to program the designated LBAs of data to multiple NAND flash units in one input/output channel, or read the designated LBAs of data from multiple NAND flash units in one input/output channel in parallel In some embodiments, certain space of the RAM 136 is allocated for a command queue (CQ) to store the commands, such as host read, write, erase commands, etc., issued by the host side 110 in the order of the time when the commands arrive to the flash controller 130. Refer to FIG. 3. The CQ 300 contains a collection of entries. Each entry of the CQ 300 may store one host command, such as a host read command (represented by a notation "R"), a host write command (represented by a notation "W"), etc. The principle operations on the CQ 300 are the addition of entities to the rear terminal position (for example, the position pointed by a pointer "T"), known as enqueue, and removal of entities from the front terminal position (for example, the position pointed by a pointer "H"), known as dequeue. That is, the first command added to the CQ 300 will be the first one to be removed, which conforms to the First-In First-Out (FIFO) principle.

Figure 4:
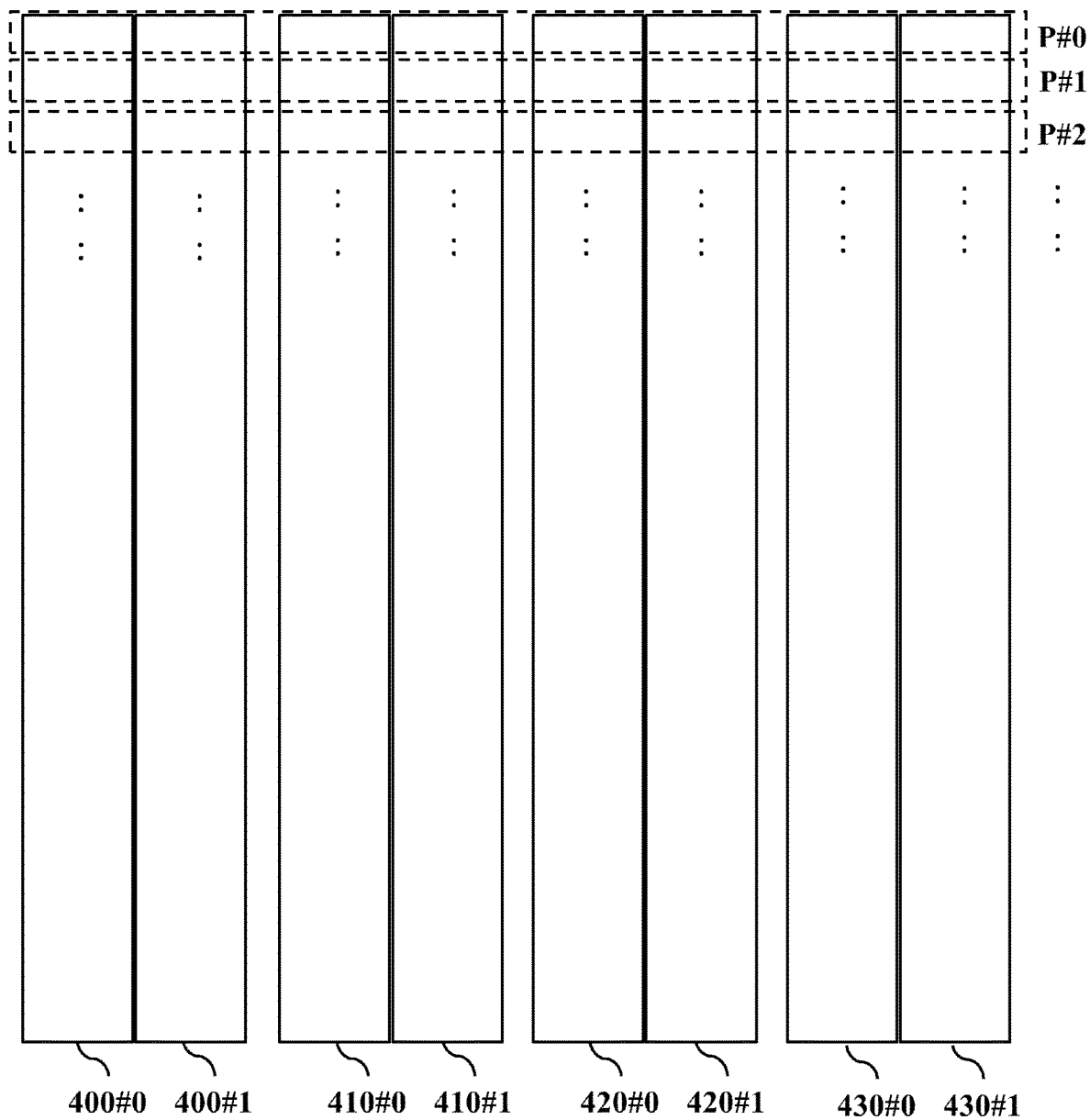
FIG. 4 is a schematic diagram of super pages according to an embodiment of the invention.

One NAND flash unit may include multiple data planes, each data plane may include multiple physical blocks, and each physical block may include multiple physical pages. For example, refer to FIG. 4. Each NAND flash unit includes two data planes. The NAND flash unit 153 #0 includes the data planes 400 #0 and 400 #1, the NAND flash unit 153 #1 includes the data planes 410 #0 and 410 #1, and so on. Each physical page may store 16 LBAs of data, that is, 8 KB of data. Certain pages in the NAND flash units 153 #0 to 153 #3 may form one super page to store 128 LBAs of data, that is, 64 KB of data. For example, The $0^{th}$ physical pages of the $0^{th}$ physical block in all data planes of the NAND flash units 153 #0 to 153 #3 may form the super page P #0, the $1^{st}$ physical pages of the $0^{th}$ physical block in all data planes of the NAND flash units 153 #0 to 153 #3 may form the super page P #1, and so on. In order to optimize the access performance of the flash module 150, the processing unit 134 may drive the flash I/F 139 to program the data of LBA #0 to LBA #128 into the super page P #0, to program the data of LBA #128 to LBA #255 into the super page P #1, and so on. Subsequently, the processing unit 134 may drive the flash I/F 139 to read data of LBA #0 to LBA #1 from the super page P #0, to read data of LBA #128 to LBA #255 from the super page P #1, and so on.

The host side 110 may issue a host write command to the processing unit 134 through the host I/F 131 to request the device side to write specific data, such as the file system, the root directory, the user files, etc. For example, Table 1 shows exemplary mapping table between LBA ranges and host data:

TABLE 1

| LBA Range | Host Data |
| --- | --- |
| 0x0~0x4EFF | File system and root directory |
| 0x4F00~0x204EFF | First user file (1GB) |
| 0x204F00~0x404EFF | Second user file (1GB) |
| 0x404F00~0x404F07 | Third user file (4KB) |
| 0x404F08~0x604F07 | Fourth user file (1GB) |
| 0x604F08~0x804F07 | Fifth user file (1GB) |
| 0x804F08~0xA04F07 | Sixth user file (1GB) |
| 0xA04F08~0xC04F07 | Seventh user file (1GB) |
| . | . |
| . | . |
| . | . |

The LBAs of the file system and the root directory range from "0x0" to "0x4EFF", the LBAs of the first user file range from "0x4F00" to "0x204EFF", and so on.

Figure 5:
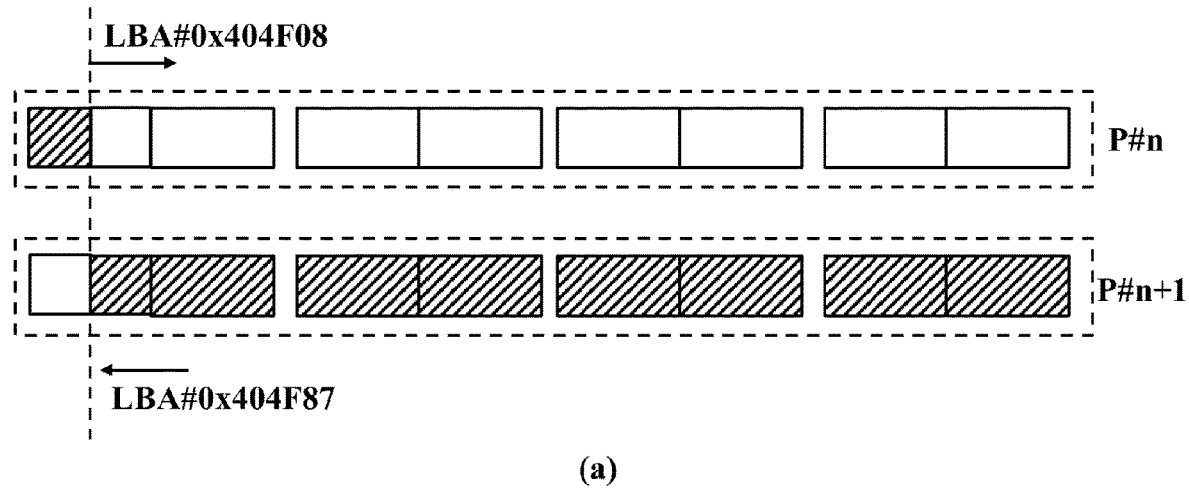
FIG. 5 is a schematic diagram illustrating filled dummy data when starting logical block address (LBA) numbers do not align with the first physical page of one super page.
Figure 5:
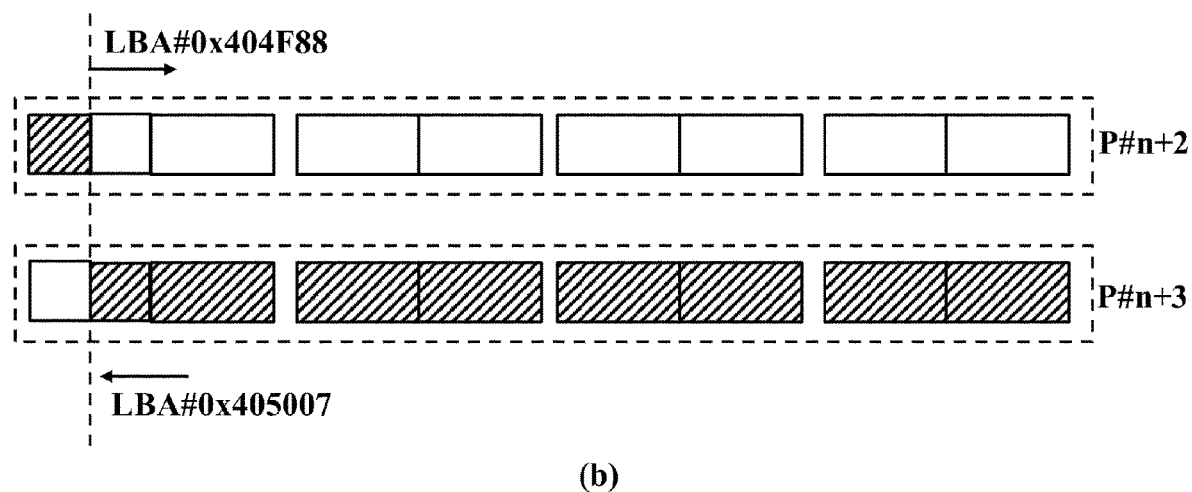

In order to optimize storage performance, the length of data to be written, which is requested by each host write command issued by the host side 110, does not exceed the length of one super page. However, if the starting LBA number of the data to be written, which is requested by one host write command, does not align with the first physical page of a super page in the flash module 150, then the data write performance would be degraded dramatically. For example, for writing the fourth user file, the host side 110 issues several host write commands to the device side sequentially, which request to write the data of LBAs ranging from "0x404F08" to "0x404F87", from "0x404F88" to "0x405007", from "0x405008" to "0x405087", from "0x405088" to "0x405107", and so on. In some implementations, the firmware translation layer (FTL) when being executed by the processing unit 134 receives the above host write commands through the CQ 300. Subsequently, the FTL, for each host write command, programs 64 KB of data into two super pages, and fills with dummy data in proper locations. Refer to part (a) of FIG. 5. The FTL generates two segments of 64 KB data for two super pages in accordance with the data of LBAs ranging from "0x404F08" to "0x404F87". The first segment of 64 KB data includes 4 KB of dummy data, and the 60 KB data of LBAs ranging from "0x404F08" to "0x404F7F" in sequence. The second segment of 64 KB data includes the 4 KB data of LBAs ranging from "0x404F80" to "0x404F87", and 60 KB of dummy data in sequence. Next, the FTL drives the flash I/F 139 to program the first segment of 64 KB data into the super page P #n in the flash module 150, and program the second segment of 64 KB data into the super page P #n+1 in the flash module 150, where "n" represents an integer. Refer to part (b) of FIG. 5. The FTL generates two segments of 64 KB data for two super pages in accordance with the data of LBAs ranging from "0x404F88" to "0x405007". The first segment of 64 KB data includes 4 KB of dummy data, and the 60 KB data of LBAs ranging from "0x404F88" to "0x404FFF" in sequence. The second segment of 64 KB data includes the 4 KB data of LBAs ranging from "0x405000" to "0x405007", and 60 KB of dummy data in sequence. Next, the FTL drives the flash I/F 139 to program the first segment of 64 KB data into the super page P #n+2 in the flash module 150, and program the second segment of 64 KB data into the super page P #n+3 in the flash module 150, where "n" represents an integer. From the examples in FIG. 5, it would be seen that the FTL consumes time and computing resources to fill in dummy data, and the flash module 150 spends storage space to store the useless dummy data, resulting in a significant decrease in the performance of data writing. Additionally, when hos read commands requesting to read the aforementioned data are executed, the flash module 150 consumes time to read the useless dummy data, and the FTL consumes time and computing resources to remove the dummy data, resulting in a significant decrease in the performance of data read.

In order to address the aforementioned problems, in an embodiment of the invention, a dedicated LBA shifting circuit is set in the host I/F 131 to detect whether there are a preset number of successive unaligned host long-write commands, and the starting LBA number of the data to be written, which is requested by each unaligned host long-write command, does not align with the first physical page of a super page in the flash module 150. If so, the LBA shifting circuit calculates an offset, so that the starting LBA number of the data to be written, which is requested by a current host long-write command, plus the offset aligns with the first physical page of a super page in the flash module 150. Thereafter, the LBA shifting circuit stores an entry in an LBA shifting table thereof, which includes information about the starting LBA number (treated as a separating LBA number) of the data to be written, which is requested by a current host long-write command, and the offset, so that the starting LBA numbers of the data to be written, which are greater than the separating LBA number, plus the offset align with the first physical page of a super page in the flash module 150. Next, the LBA shifting circuit outputs the current host long-write command to the CQ 300, which carries the modified parameters, such as the starting LBA number, the length, etc., to enable the FTL to drive the flash I/F 139 for performing the designated write operation in accordance with the enqueued host long-write command.

Additionally, the dedicated LBA shifting circuit is used, when a starting LBA number carried in a host write command, a host read command or a host erase command is equal to or greater than the separating LBA number, to add the offset to the starting LBA number carried in the host write command, the host read command or the host erase command, and output the host write command, the host read command or the host erase command to the CQ 300, which carries the modified parameters, such as the starting LBA number, the length, etc., to enable the FTL to drive the flash I/F 139 for performing the designated write, read, or erasure operation in accordance with the enqueued the host write command, the host read command or the host erase command.

Figure 6:
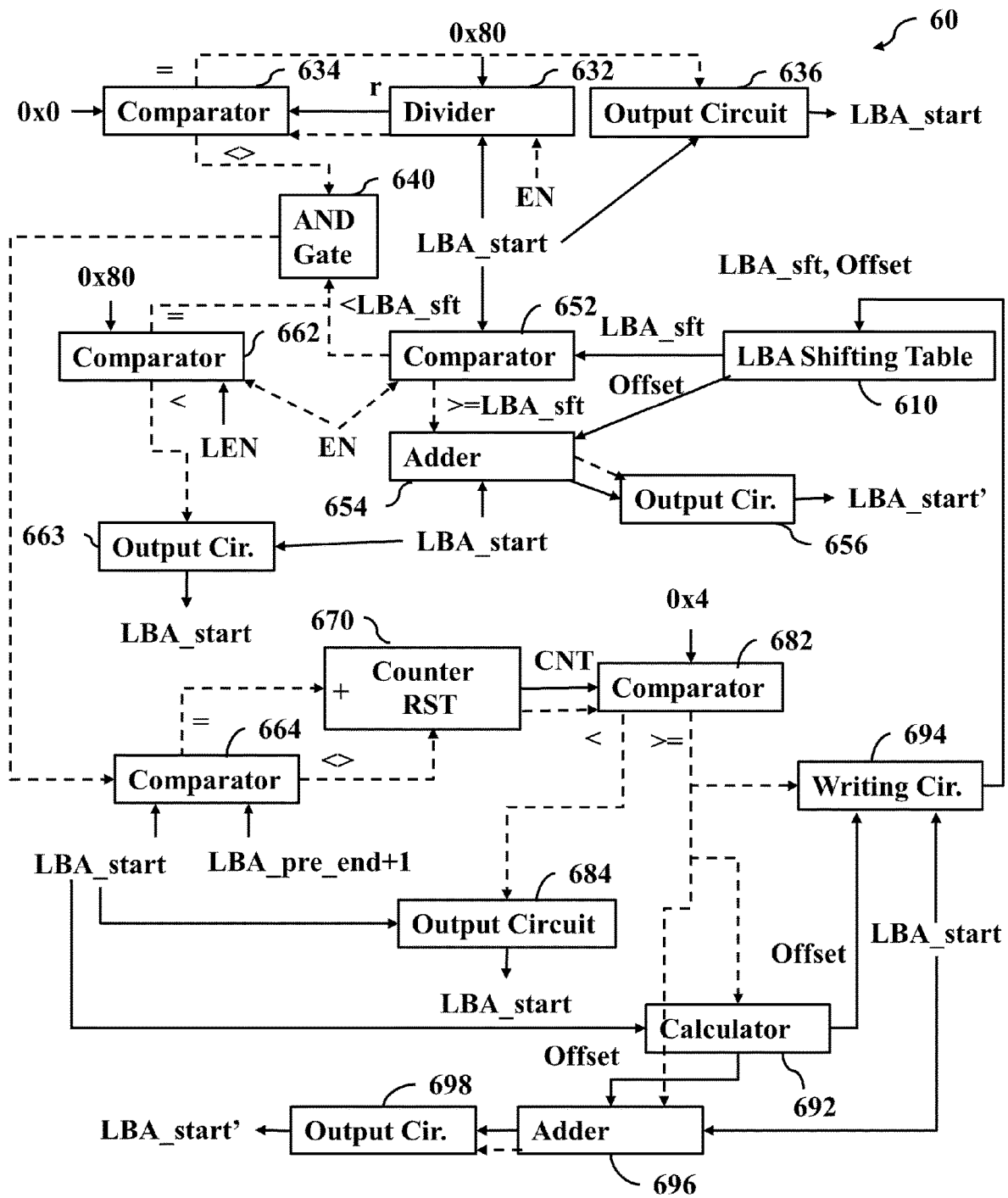
FIG. 6 is a block diagram of an LBA shifting circuit for processing host write commands according to an embodiment of the invention.
Figure 7:
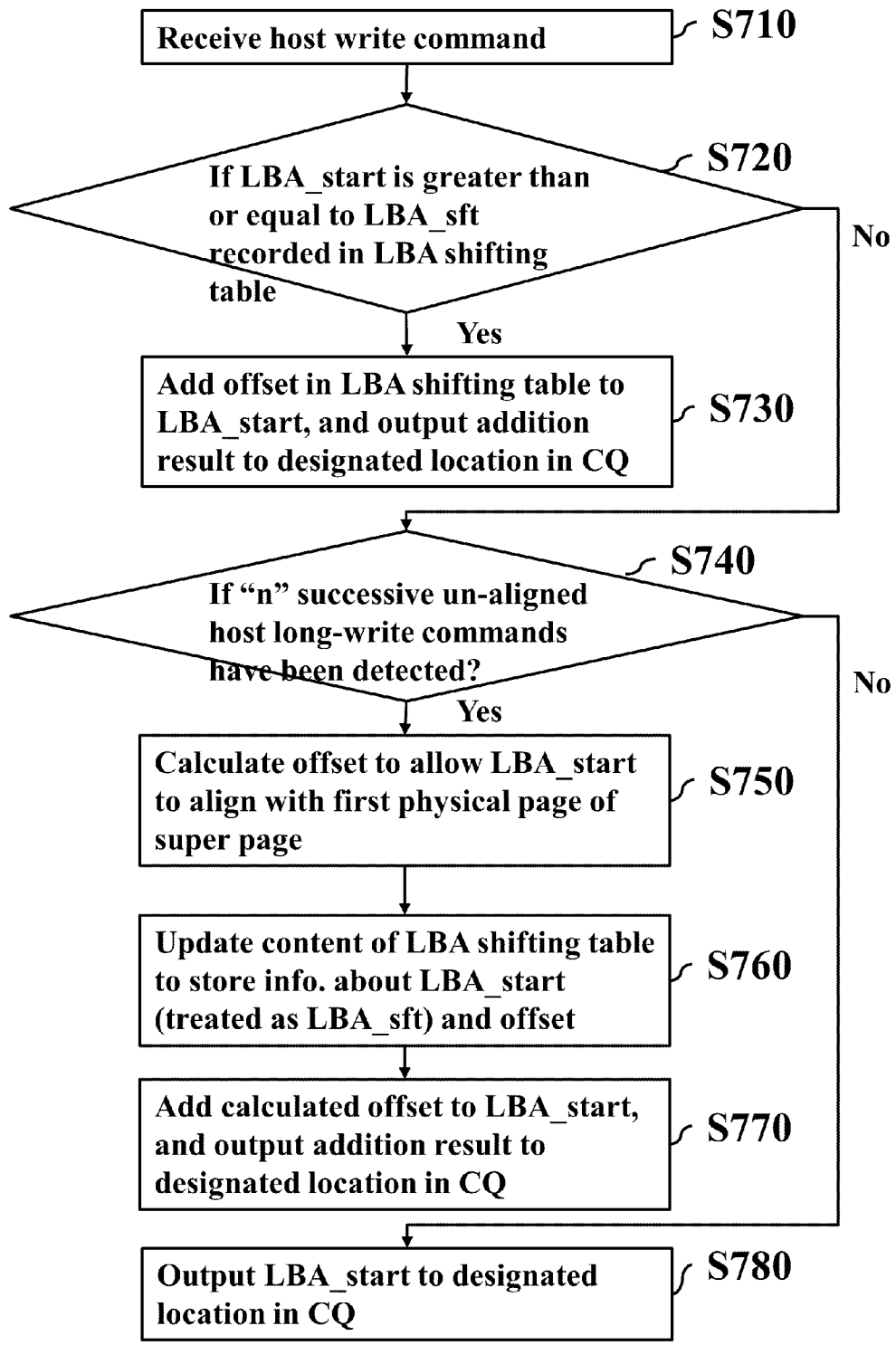
FIG. 7 is a flowchart illustrating a method for processing a host write command according to an embodiment of the invention.

With reference made to an embodiment of the LBA shifting circuit 60 as shown in FIG. 6, an embodiment of the invention introduces a method for processing a host write command, performed by the host I/F 131, as shown in FIG. 7. The detailed description is as follows:

Step S710: A host write command is received from the host side 110. The host write command carries at least parameters, such as an operation code (opcode), a starting LBA number "LBA_start", a length "LEN", etc., and the parameters are stored in registers in the host I/F 131. The registers in the host I/F 131 records the LBA shifting table 610 for storing information about the separating LBA number and the offset. To simplify the description, an embodiment of the invention describes that the LBA shifting table 610 stores an entry including a pair of the separating LBA number "LBA_sft" and the offset "Offset". Initially, the LBA shifting table 610 may stores the entry including the separating LBA number "0xFFFFFF" and the offset "0x0". The host I/F 131 includes a register for storing an ending LBA number of the data to be written, which is requested by the previous host write command, plus one, d denoted as "LBA_pre_end+1".

Step S720: It is determined whether the starting LBA number "LBA_start" is greater than or equal to the separating LBA number "LBA_sft" recorded in the LBA shifting table 610. If so, the process proceeds to step S730. Otherwise, the process proceeds to step S740. For example, when the LBA shifting circuit 60 starts to operate, the comparator 652 is activated with the signal "EN". The comparator 652 compares LBA_start with LBA_sft in the LBA shifting table 610. If LBA_start is greater than or equal to the LBA_sft, then the comparator 652 outputs a signal to activate the adder 654. Otherwise, the comparator 652 outputs a signal to the AND gate 640.

Step S730: The offset "Offset" recorded in the LBA shifting table 610 is added to LBA_start, and the addition result is output to the designated location in the CQ 300. For example, the adder 654 adds the offset "Offset" recorded in the LBA shifting table 610 to LBA_start, and drives the output circuit 656 to output the addition result "LBA_start'" to the designated location in the CQ 300.

Step S740: It is determined whether "n" successive un-aligned host long-write commands have been detected, where "n" is an integer greater than one. If so, then the process proceeds to step S750. Otherwise, the process proceeds to step S780. For example, "n" is set to four.

For example, when the LBA shifting circuit 60 starts to operate, the divider 632 is activated with the signal "EN" to divide LBA_start by the maximum number of LBAs of data that can be stored in one super page (for example, 128, denoted as "0x80"). The divider 632 drives the comparator 634, and outputs the calculated remainder "r" to the comparator 634. The comparator 634 is used to determine whether the remainder "r" equals 0. If so, it means that the starting LBA of this host write command aligns with the first physical page of a super page, and the comparator 634 outputs a signal to activate the output circuit 636. If the remainder "r" does not equal 0, it means that the starting LBA of this host write command does not align with the first physical page of a super page, and the comparator 634 outputs a signal to the AND gate 640.

When the LBA shifting circuit 60 starts to operate, the comparator 662 is activated with the signal "EN" to determine whether the length of data to be written, which is requested by this host write command, is equal to or greater than the maximum number of LBAs of data that can be stored in one super page. If so, it means that this host write command is a long-write command, and the comparator 662 outputs a signal to the AND gate 640. Otherwise, it means that this host write command is not a long-write command, and the comparator 662 outputs a signal to the output circuit 663 to activate the output circuit 663.

When the AND gate 640 receives three input signals from the comparators 634, 652, and 662, it means that the comparator 634 detects that LBA_start of this host write command does not align with the first physical page of a super page, the comparator 652 detects that LBA_start of this host write command is smaller than LBA_sft recorded in the LBA shifting table 610, and the comparator 662 detects that this host write command is a long-write command, and the AND gate 640 outputs a signal to the comparator 664 to activate the comparator 664.

The comparator 664 determines whether LBA_start of this host write command equals LBA_pre_end+1. If so, it means that this host write command in conjunction with the previous host write command forms a successive write operation, and the comparator 664 outputs a signal to the counter 670 to increase the counter 670 by one. Otherwise, it means that this host write command in conjunction with the previous host write command does not form a successive write operation, and the comparator 664 outputs a signal to the counter 670 to reset the counter 670 to 0. The value output from the counter 670 indicates a total number of successive host write commands.

The comparator 670 being modified outputs the counter "CNT" and drives the comparator 682. The comparator 682 determines whether CNT is greater than or equal to a preset value (for example, "0x4"). If so, it means that the comparator 682 detects a preset number of successive host long-write commands, and the comparator 682 outputs signals to activate the calculator 692, the writing circuit 694, and the adder 696. Otherwise, the comparator 682 outputs a signal to the output circuit 684 to drive the output circuit 684.

Step S750: An offset is calculated to allow LBA_start of this host write command to align with the first physical page of a super page. For example, when the eight least significant bits (LSBs) of LBA_start is greater than "0x80", the calculator 692 subtracts the eight LBSs of LBA_start from "0x100" to obtain the offset "Offset". When the eight LSBs of LBA_start is smaller than "0x80", the calculator 692 subtracts the eight LBSs of LBA_start from "0x80" to obtain the offset "Offset".

Step S760: The content of LBA shifting table 610 is updated to store information about this LBA_start (treated as separating LBA number) and the offset. For example, the writing circuit 694 overwrites the original LBA_sft stored in the LBA shifting table 610 with LBA_start, and overwrites the original offset stored in the LBA shifting table 610 with the calculated Offset. It should be noted that the updated LBA shifting table 610 will be programmed into the flash module 150 as a backup at an appropriate time point to prevent a sudden power off (SPO).

Step S770: The calculated offset "Offset" is added to LBA_start, and the addition result is output to the designated location in the CQ 300. For example, the adder 696 adds the offset "Offset" output from the calculator 692 to LBA_start, and drives the output circuit 698 to output the addition result "LBA_start'" to the designated location in the CQ 300. It should be noted that the addition result can be evenly divided by the length of one super page, where the length is represented by a total number of LBAs.

Step S780: LBA_start is output to the designated location in the CQ 300. For example, the output circuits 636, 663, or 684 when being driven outputs LBA_start to the designated location in the CQ 300.

Although the embodiment as shown in FIG. 6 describes the output circuits 636, 663, and 684 are different components, those artisans may realize any to or all of the output circuits 636, 663 and 684 as the same component, and the invention should not be limited thereto. Although the embodiment as shown in FIG. 6 illustrates that the adder 654 and the output circuit 656, and the adder 696 and the output circuit 698 are different paired components, those artisans may realize the above as the same paired components, and the invention should not be limited thereto.

Following the host data as shown in Table 1, assume that the host side 110 issues a series of host write commands, as shown in Table 2, to request the device side to write data of the fourth user file:

TABLE 2

| Host Write Command No. | Starting LBA Number | Length |
|---|---|---|
| W#0 | 0x404F08 | 0x80 |
| W#1 | 0x404F88 | 0x80 |
| W#2 | 0x405008 | 0x80 |
| W#3 | 0x405088 | 0x80 |
| W#4 | 0x405108 | 0x80 |
| W#5 | 0x405188 | 0x80 |
| . | . | . |
| . | . | . |
| . | . | . |

Since the LBA shifting circuit 60 when processing the host write command "W #3" detects four un-aligned successive host long-write commands (the "Yes" path of step S740), the offset is calculated to be "0x78" (step S750); the content of LBA shifting table 610 is updated to store information about the separating LBA number "0x405088" and the offset "0x78" (step S760); and the updated starting LBA number "0x405100" is output to the designated location in the CQ 300 (step S770).

Next, since the starting LBA numbers of the host write commands after the host write command "W #4" are greater than the separating LBA number "0x405088" recorded in the LBA shifting table 610 (the "Yes" path of step S740), the LBA shifting circuit 60 adds the offset "0x78" recorded in the LBA shifting table 610 to each starting LBA number, and outputs the addition results to the designated locations in the CQ 300 (step S730). Table 3 shows the changes of the starting LBA numbers after being processed by the LBA shifting circuit 60:

TABLE 3

| Host Write Command No. | Starting LBA Number | Length |
|---|---|---|
| W#0 | 0x404F08 | 0x80 |
| W#1 | 0x404F88 | 0x80 |
| W#2 | 0x405008 | 0x80 |
| W#3 | ~~0x405088~~ 0x405100 | 0x80 |
| W#4 | ~~0x405108~~ 0x405180 | 0x80 |
| W#5 | ~~0x405188~~ 0x405200 | 0x80 |
| . | . | . |
| . | . | . |
| . | . | . |

Figure 8:
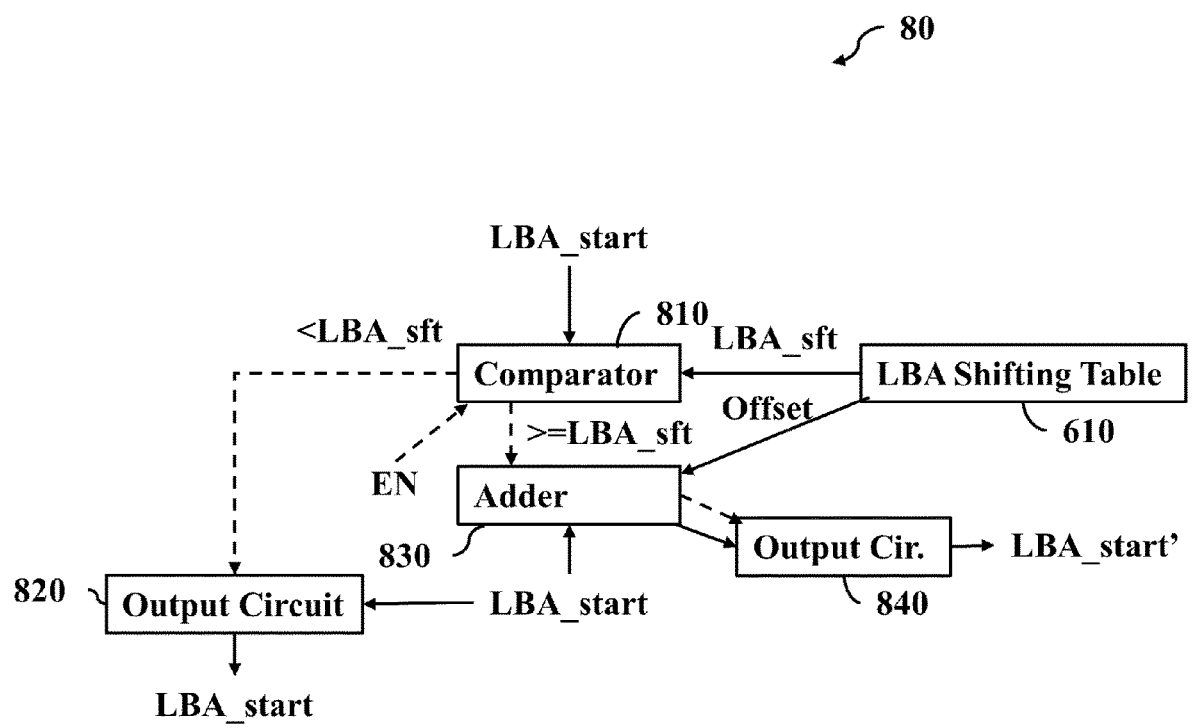
FIG. 8 is a block diagram of an LBA shifting circuit for processing host read and erase commands according to an embodiment of the invention.
Figure 9:
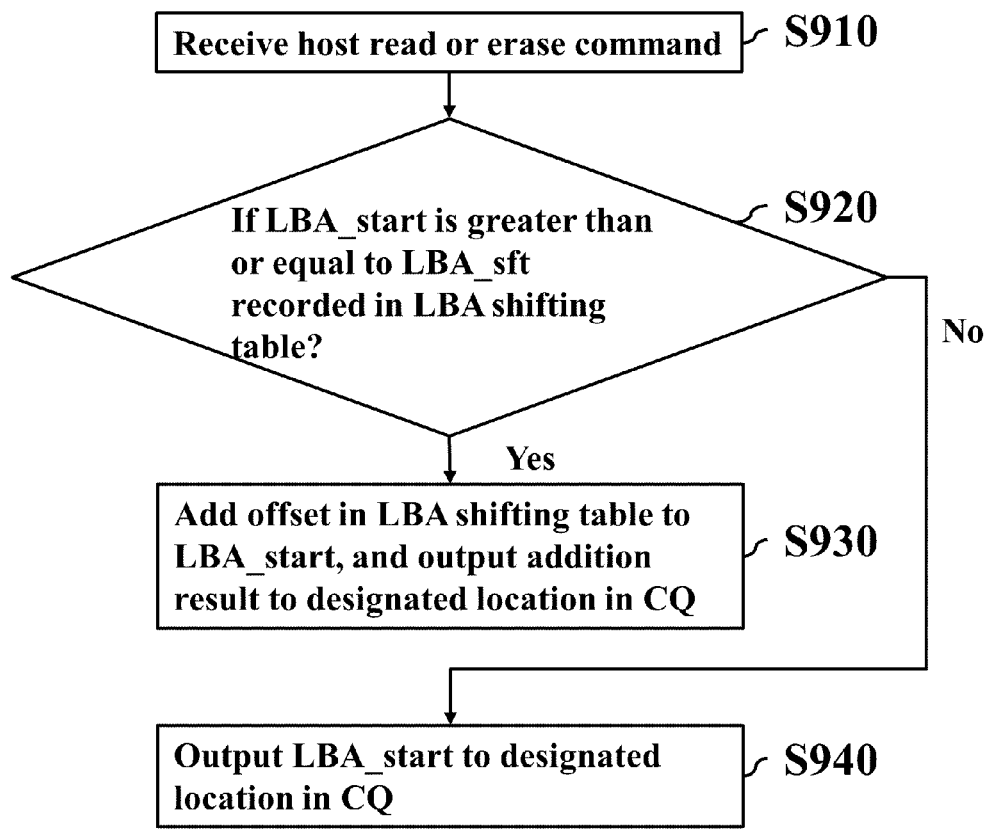
FIG. 9 is a flowchart illustrating a method for processing a host read or erase command according to an embodiment of the invention.

With reference made to an embodiment of the LBA shifting circuit 80 as shown in FIG. 8, an embodiment of the invention introduces a method for processing a host read command or a host erase command, performed by the host I/F 131, as shown in FIG. 9. The detailed description is as follows:

Step S910: A host write or erase command is received from the host side 110. The host read or erausre command carries at least parameters, such as an opcode, a starting LBA number "LBA_start", a length "LEN", etc., and the parameters are stored in registers in the host I/F 131.

Step S920: It is determined whether the starting LBA number "LBA_start" is greater than or equal to the separating LBA number "LBA_sft" recorded in the LBA_shifting table 610. If so, the process proceeds to step S930. Otherwise, the process proceeds to step S940. For example, when the LBA shifting circuit 80 starts to operate, the comparator 810 is activated with the signal "EN". The comparator 810 compares LBA_start with LBA_sft in the LBA shifting table 610. If LBA_start is greater than or equal to the LBA_sft, then the comparator 810 outputs a signal to activate the adder 830. Otherwise, the comparator 810 outputs a signal to activate the output circuit 820.

Step S930: The offset "Offset" recorded in the LBA shifting table 610 is added to LBA_start, and the addition result is output to the designated location in the CQ 300. For example, the adder 830 adds the offset "Offset" recorded in the LBA shifting table 610 to LBA_start, and drives the output circuit 840 to output the addition result "LBA_start'" to the designated location in the CQ 300.

Step S940: LBA_start is output to the designated location in the CQ 300. For example, the output circuit 820 when being driven outputs LBA_start to the designated location in the CQ 300.

Following the host data as shown in Table 1, assume that the host side 110 issues a series of host read commands, as shown in Table 4, to request the device side to read data of the third and the fourth user files:

TABLE 4

| Host Read Command No. | Starting LBA Number | Length |
|---|---|---|
| R#0 | 0x404F00 | 0x8 |
| R#1 | 0x404F08 | 0x80 |
| R#2 | 0x404F88 | 0x80 |
| R#3 | 0x405008 | 0x80 |
| R#4 | 0x405088 | 0x80 |
| R#5 | 0x405108 | 0x80 |
| R#6 | 0x405188 | 0x80 |
| . | . | . |
| . | . | . |
| . | . | . |

Since the LBA shifting circuit 80 when processing the host read command "R #0" to "R #3" detects that their starting LBA numbers are smaller than the separating LBA number "0x405088" recorded in the LBA shifting table 610 (the "No" path of step S920), the starting LBA numbers are output to the designated locations in the CQ 300 directly (step S940).

Next, since the starting LBA numbers of the host read commands after the host read command "R #4" are greater than the separating LBA number "0x405088" recorded in the LBA shifting table 610 (the "Yes" path of step S920), the LBA shifting circuit 80 adds the offset "0x78" recorded in the LBA shifting table 610 to each starting LBA number, and outputs the addition results to the designated locations in the CQ 300 (step S930). Table 5 shows the changes of the starting LBA numbers after being processed by the LBA shifting circuit 80:

TABLE 5

| Host Read Command No. | Starting LBA Number | Length |
|---|---|---|
| R#0 | 0x404F00 | 0x8 |
| R#1 | 0x404F08 | 0x80 |
| R#2 | 0x404F88 | 0x80 |
| R#3 | 0x405008 | 0x80 |
| R#4 | ~~0x405088~~ 0x405100 | 0x80 |
| R#5 | ~~0x405108~~ 0x405180 | 0x80 |
| R#6 | ~~0x405188~~ 0x405200 | 0x80 |
| . | . | . |
| . | . | . |
| . | . | . |

Although the embodiment as shown in FIG. 8 describes that the LBA shifting circuit 80 is a device independent of the LBA shifting circuit 60, those artisans may integrate the components 810 to 840 of FIG. 8 into the circuit of FIG. 6, and the invention should not be limited thereto. For example, each component in FIG. 6 is controlled by a mode signal, which instructs each component in FIG. 6 to operate in the data-writing mode and the non-data-writing mode (including the data-reading mode, the data-erasure mode, and the like). When the mode signal indicates the LBA shifting circuit 60 is operated in the data-writing mode, each component in FIG. 6 can be activated to complete the operation associated with the host write commands as described above. When the mode signal indicates the LBA shifting circuit 60 is operated in the non-data-writing mode, only specific components (such as the components 610, 652, 654, 656, 636, etc.) in FIG. 6 can be activated to complete the operation associated with the host read or erase commands as described above.

Although the embodiments describe that the output circuits shown in FIGS. 6 and 8 are used to output the original or modified starting LBA numbers to the designated locations in the CQ 300, those artisans may realize each output circuit to further output relevant information together with the original or modified starting LBA number, such as a command number, a command type, an opcode, a length, and others to the designated locations in the CQ 300, and the invention should not be limited thereto.

Through the arrangement of the aforementioned LBA shifting circuits 60 and 80 as described above, the disadvantages shown in FIG. 5 are avoided. That is, the FTL would save time and computing resources to fill in dummy data, and to drive the flash I/F 139 to program unnecessary dummy data into the flash module 150. Additionally, the FTL would save time to drive the flash I/F 139 to read necessary dummy data from the flash module 150.

Although the embodiment has been described as having specific elements in FIGS. 1, 2, 6, and 8, it should be noted that additional elements may be included to achieve better performance without departing from the spirit of the invention. Each element of FIGS. 1, 2, 6, and 8, is composed of various circuits and arranged to operably perform the aforementioned operations. While the process flows described in FIGS. 7, and 9 include a number of operations that appear to occur in a specific order, it should be apparent that these processes can include more or fewer operations, which can be executed serially or in parallel (e.g., using parallel processors or a multi-threading environment). It is to be understood that the operations following one path of any determination or judgment step are operations in response that a specific condition has been met in the determination or judgment step.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for executing host commands, performed by a host interface in a flash controller, wherein the host interface is coupled to a host side, the method comprising:
   determining whether a preset number of successive unaligned host long-write commands have been detected, wherein a first starting logical block address (LBA) number of data to be written, which is requested by each unaligned host long-write command, does not align with a first physical page of one super page in a flash module;
   when determining that the preset number of successive unaligned host long-write commands have been detected, calculating an offset, so that a second starting LBA number of data to be written, which is requested by a host write command, plus the offset aligns with a first physical page of one super page in the flash module;
   generating a third starting LBA number by adding the offset to the second starting LBA number;
   storing an entry in an LBA shifting table, which comprises information about the second starting LBA number and the offset, wherein the second starting LBA number represents a separating LBA number; and
   outputting the third starting LBA number associated with the host write command to a designated location in a command queue, thereby enabling a firmware translation layer to drive a flash interface for programming data into the flash module in accordance with the third starting LBA address associated with the host write command.

2. The method of claim 1, wherein the successive unaligned host long-write commands comprises the host write command.

3. The method of claim 1, wherein the third starting LBA number is evenly divided by a length of one super page.

4. The method of claim 1, comprising:
when a fourth starting LBA number carried in a host command is equal to or greater than the separating LBA number, generating a fifth starting LBA number by adding the offset to the fourth starting LBA number; and
outputting the fifth starting LBA number associated with the host command to a designated location in the command queue, thereby enabling the firmware translation layer to drive a flash interface for completing a corresponding operation in accordance with the fifth starting LBA address associated with the host command.

5. The method of claim 4, wherein the fifth starting LBA number is evenly divided by a length of one super page.

6. The method of claim 4, wherein the host command is a host write command requesting the flash controller to write data into the flash module.

7. The method of claim 4, wherein the host command is a host read command requesting the flash controller to read data from the flash module, or a host erase command requesting the flash controller to erase data from the flash module.

8. The method of claim 1, comprising:
programming the LBA shifting table into the flash module as a backup.

9. An apparatus for executing host commands, comprising:
a flash interface, coupled to a flash module;
a random access memory (RAM), arranged operably to allocate space for a command queue;
a processing unit, coupled to the RAM and the flash interface; and
a host interface, coupled to a host side and the RAM, comprising:
a first logical block address (LBA) shifting circuit, arranged operably to determine whether a preset number of successive unaligned host long-write commands have been detected, wherein a first starting LBA number of data to be written, which is requested by each unaligned host long-write command, does not align with a first physical page of one super page in a flash module; when determining that the preset number of successive unaligned host long-write commands have been detected, calculate an offset, so that a second starting LBA number of data to be written, which is requested by a host write command, plus the offset aligns with a first physical page of one super page in the flash module; generate a third starting LBA number by adding the offset to the second starting LBA number; store an entry in an LBA shifting table, which comprises information about the second starting LBA number and the offset, in the RAM, wherein the second starting LBA number represents a separating LBA number; and output the third starting LBA number associated with the host write command to a designated location in the command queue, thereby enabling a firmware translation layer to drive the flash interface for programming data into the flash module in accordance with the third starting LBA address associated with the host write command.

10. The apparatus of claim 9, wherein the first LBA shifting circuit comprises:
a counter;
an AND gate;
a divider, arranged operably to divide the second starting LBA number by a maximum number of LBAs that can be stored in one super page, and output a calculated remainder;
a first comparator, coupled to the divider, arranged operably to receive the remainder, and output a first signal to the AND gate when the remainder equals to 0;
a second comparator, arranged operably to output a second signal to the AND gate when a length of data to be written, which is requested by the host write command, is equal to or greater than a maximum number of LBAs of data that can be stored in one super page;
a third comparator, arranged operably to determine whether the second starting LBA number is equal to an ending LBA number of data, which is requested by a previous host write command, plus 1 when receiving a third signal corresponding to the first signal and the second signal from the AND gate; and if so, increase the counter by one;
a fourth comparator, coupled to the counter, arranged operably to activate a calculator, an adder, and a writing circuit when a counter value is greater than or equal to a preset value;
the calculator, coupled to the fourth comparator, arranged operably to calculate the offset;
the adder, coupled to the fourth comparator, arranged operably to generate the third starting LBA number by adding the offset to the second starting LBA number;
the writing circuit, arranged operably to store the entry in the LBA shifting table; and
an output circuit, coupled to the adder, arranged operably to output the third LBA number to the designated location in the command queue.

11. The apparatus of claim 9, wherein the LBA shifting table is programmed into the flash module as a backup.

12. The apparatus of claim 9, wherein the third starting LBA number is evenly divided by a length of one super page.

13. The apparatus of claim 9, wherein the successive unaligned host long-write commands comprises the host write command.

14. The apparatus of claim 9, wherein the host interface comprises:
a second LBA shifting circuit, arranged operably to generate a fifth starting LBA number by adding the offset to the fourth starting LBA number when a fourth starting LBA number carried in a host command is equal to or greater than the separating LBA number; and output the fifth starting LBA number associated with the host command to a designated location in the command queue, thereby enabling the firmware translation layer to drive a flash interface for completing a corresponding operation in accordance with the fifth starting LBA address associated with the host command.

15. The apparatus of claim 14, wherein the second LBA shifting circuit comprises:
a comparator, arranged operably to drive an adder when the fourth starting LBA number is equal to or greater than the separating LBA number;

the adder, coupled to the comparator, arranged operably to generate the fifth starting LBA number by adding the offset to the fourth starting LBA number; and an output circuit, coupled to the adder, arranged operably to output the fifth starting LBA number associated with the host command to the designated location in the command queue.

16. The apparatus of claim 14, wherein the fifth starting LBA number is evenly divided by a length of one super page.

17. The apparatus of claim 14, wherein the host command is a host write command, and the host side issues the host write command to request the apparatus to write data starting from the fourth starting LBA number into the flash module, and a length of the data to be written equals to a length of one super page.

18. The apparatus of claim 14, wherein the host command is a host read command, and the host side issues the host read command to request the apparatus to read data starting from the fourth starting LBA number from the flash module.

19. The apparatus of claim 14, wherein the host command is a host erase command, and the host side issues the host erase command to request the apparatus to erase data starting from the fourth starting LBA number from the flash module.

20. The apparatus of claim 9, wherein each unaligned host long-write command requests the apparatus to write one super page of data into the flash module.

* * * * *